(12) United States Patent
Liu

(10) Patent No.: US 6,651,734 B1
(45) Date of Patent: Nov. 25, 2003

(54) MULTI-ELEMENT HEAT DISSIPATING MODULE

(76) Inventor: Jefferson Liu, No. 13-8, Shuiching Lane, Shuiching, Peitun, Taichung (TW)

( * ) Notice: Subject to any disclaimer, the term of this patent is extended or adjusted under 35 U.S.C. 154(b) by 0 days.

(21) Appl. No.: 10/358,505

(22) Filed: Feb. 4, 2003

(30) Foreign Application Priority Data

Dec. 15, 2002 (TW) .......................................... 091221115

(51) Int. Cl.[7] .................................................. H05K 7/20
(52) U.S. Cl. .............................. 165/80.3; 165/104.33; 165/121; 361/697; 361/700; 361/704
(58) Field of Search ........................... 165/80.3, 104.21, 165/104.33, 185, 121; 361/697, 704, 709, 710, 700; 257/719, 722; 174/16.3

(56) References Cited

U.S. PATENT DOCUMENTS

| | | | | |
|---|---|---|---|---|
| 5,437,328 A | * | 8/1995 | Simons | ....................... 165/146 |
| 6,009,938 A | * | 1/2000 | Smith et al. | ................. 165/185 |
| 6,189,601 B1 | * | 2/2001 | Goodman et al. | ......... 165/80.3 |
| 6,263,957 B1 | * | 7/2001 | Chen et al. | ................. 165/80.4 |
| 6,352,104 B1 | * | 3/2002 | Mok | .......................... 165/80.3 |
| 6,396,693 B1 | * | 5/2002 | Shih | ............................ 361/703 |

* cited by examiner

*Primary Examiner*—Allen Flanigan
(74) *Attorney, Agent, or Firm*—Pro-Techtor International Services

(57) ABSTRACT

A heat dissipating module comprises a large heat dissipating element having a base and a first fin set on an upper side of the base; a lateral side of the base having a plurality of holes; a plurality of small heat dissipating elements; each small heat dissipating element having a base and a second fin set; the small heat dissipating elements being placed upon an upper side of the first fin set; a lateral side of each small heat dissipating element having a hole; and a plurality of heat conducting elements which are embedded into the holes of the small heat dissipating elements and the large heat dissipating element.

2 Claims, 3 Drawing Sheets

MULTI-ELEMENT HEAT DISSIPATING MODULE

FIELD OF THE INVENTION

The present invention relates to heat dissipating module, and particularly to a heat dissipating module having a large heat dissipating element and a plurality of small heat dissipating elements and are placed upon the large heat dissipating element.

BACKGROUND OF THE INVENTION

Currently, heat dissipating devices for low power CPUs or high heat sources are made of metal bases with metal fin sets so as to absorb heat and then dissipate heat by a fan.

This prior art way is effective in small CPUs, but for CPUs with a high operation speed, a larger amount of heat cannot be dissipated effectively. The reason is that the metal base is distant from the distal end of the fins, but only the base is in contact with the heat source (CPU). Thereby, the heat absorbed by the base cannot be transferred to the distal end of the fins quickly. Moreover, the heat absorbed by the base is not identical to that in the fin. Thereby, only the roots of the fins near the base have the ability to dissipate heat effectively, but the distal ends of fins have only little effect in heat dissipation. Therefore, the above-mentioned prior art cannot match to the need of the high speed CPU capacity.

SUMMARY OF THE INVENTION

Accordingly, the primary object of the present invention is to provide a heat dissipating module. The module comprises a large heat dissipating element having a base and a first fin set on an upper side of the base; a lateral side of the base having a plurality of holes; a plurality of small heat dissipating elements; each small heat dissipating element having a base and a second fin set; the small heat dissipating elements being placed upon an upper side of the first fin set; a lateral side of each small heat dissipating element having a hole; and a plurality of heat conducting element which are embedded into the holes of the small heat dissipating elements and the large heat dissipating element.

Another object of the present invention is to provide a heat dissipating element, wherein a fan is placed upon the second fin sets of the small heat dissipating elements.

The various objects and advantages of the present invention will be more readily understood from the following detailed description when read in conjunction with the appended drawing.

DETAILED DESCRIPTION OF THE PREFERRED EMBODIMENTS

Figure 1:
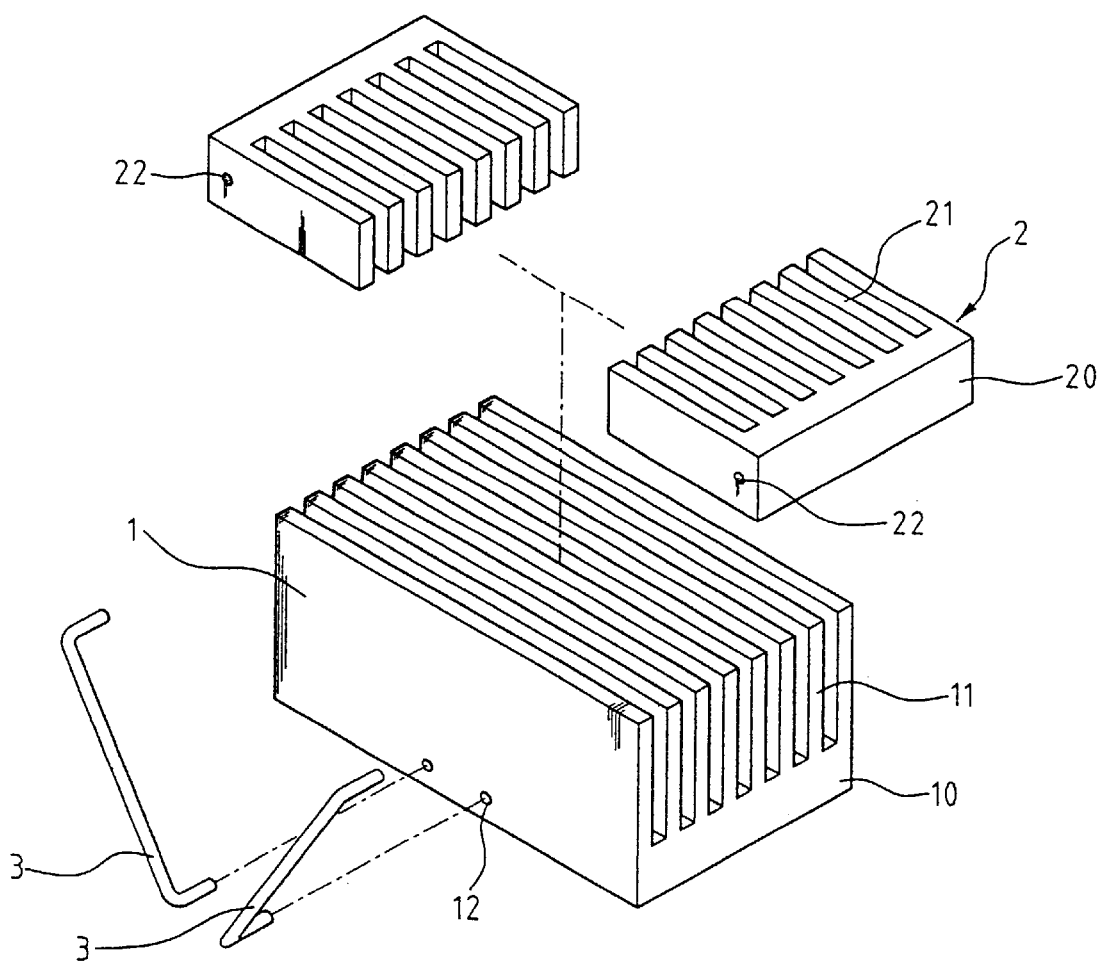
FIG. 1 is an exploded perspective view showing the large heat dissipating element, and the small heat dissipating elements of the present invention.

Referring to FIGS. 1, the device of the present invention includes a large heat dissipating element 1, at least two small heat dissipating elements 2, and at least two heat conducting elements 3. Preferably, the heat conducting elements 3 are made of super heat conducting tube which is made of metal tube (for example, copper, aluminum, or other metal tubes). An internal of the tube is filled with or contains material, which can conduct heat with a high speed.

One such material is inorganic high temperature super conductor compound, such as yttrium barium copper oxide (YBCO) super conductor material, thallium barium calcium copper oxide (TBCCO) super conductor material, mercury barium calcium copper oxide (HBCCO) super conductor material, bismuth strontium calcium copper oxide (BSCCO) super conductor material or other inorganic material.

Other possible materials include organic material, such as water.

Still other materials can conduct heat with a high speed.

In the present invention, two sides of the tube are closed so that the heat conductor material therein will not drain out. Thereby, the heat conducting element 3 is formed as a heat conduction super conductor tube.

If inorganic material is filled in the heat conducting element 3 when he at is transferred to the tube, heat energy will transfer by conduction.

When water is filled in the heat conducting element 3, the heat transfer is performed by heat convection. The heat conduction speed is very high. By experiment, it is shown that the speed of heat convention is five times of heat transfer speed in copper and over ten times of heat transfers speed in aluminum.

In the present invention, the large heat dissipating element 1 is used to contact a CPU for absorbing heat from the CPU. In general, one side of the base 10 is integrally formed with a fin set 11. Another side of the base 10 is formed with holes 12. The number of the heat conducting element 3 determines the number of the holes 12. When more heat conducting elements 3 are used, the heat conduction efficiency is higher. The small heat dissipating elements 2 have the same structure as that of the large heat dissipating element 1, but have a smaller size. In this embodiment, the total area of the two small heat dissipating elements 2 is approximately equal to that of the large heat dissipating element 1. One side of the base 20 of each small heat dissipating element 2 is formed with a hole 22.

Figure 2:
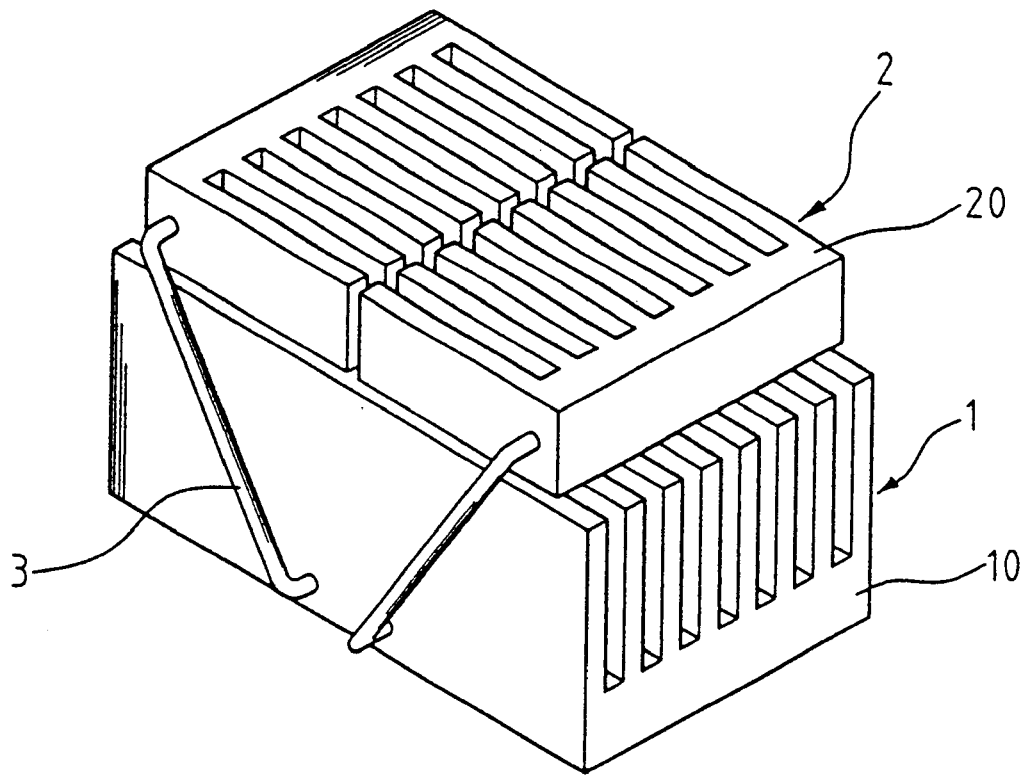
FIG. 2 is a perspective view showing the assembly of the component of the present invention.
Figure 3:
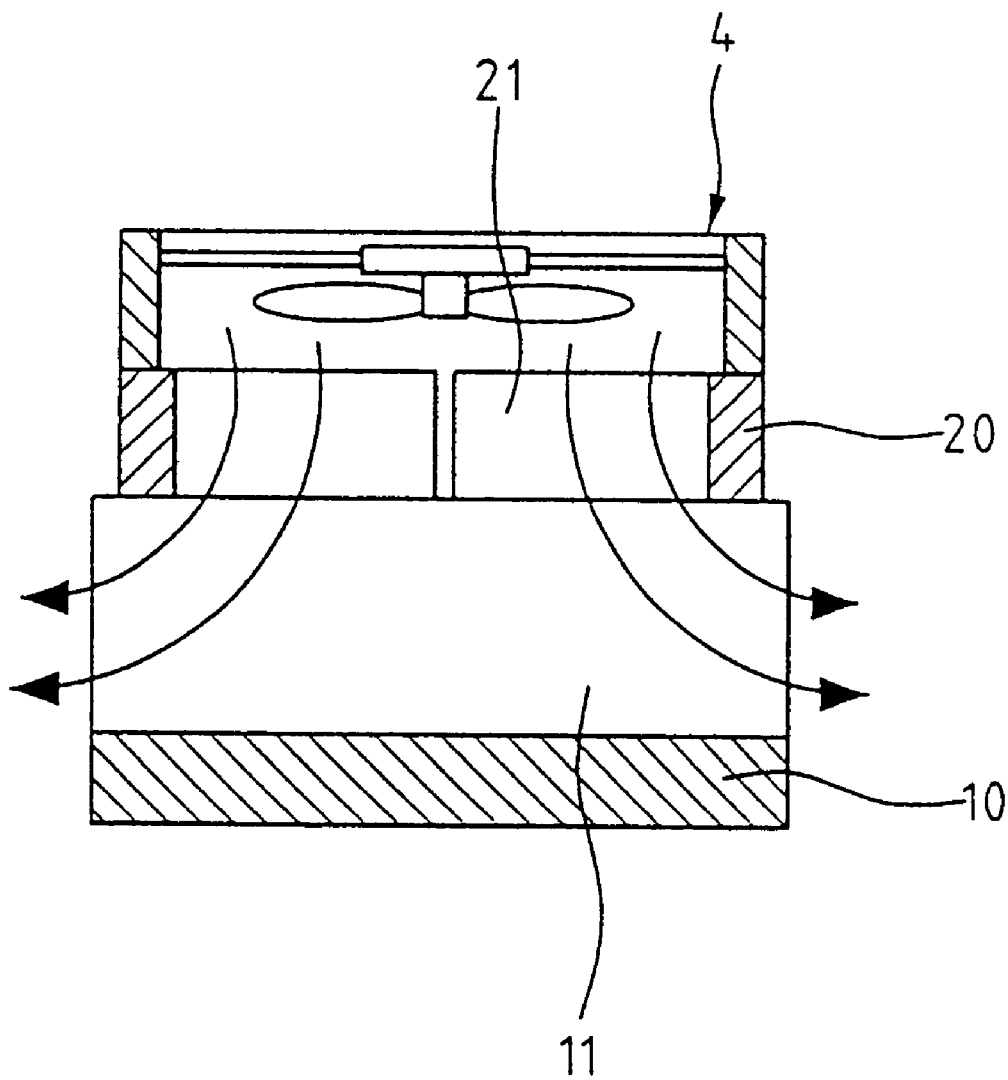
FIG. 3 is a plane cross sectional view showing that a fan is added above the small heat dissipating elements of the present invention.

FIGS. 2 and 3 show the assembly way of the present invention. The two small heat dissipating elements 2 are flatly placed at the upper side of the fin set 11 of the large heat dissipating element 1. Then U shape heat conducting elements 3 are inserted into the holes 12, 22 of the large heat dissipating element 1 and the small heat dissipating elements 2, respectively. The heat conducting glue or solder tin are used to fill gaps between the surfaces of the heat conducting element 3 and the holes 12 and 22 so as to increase the heat conduction efficiency. A plurality of fin sets can be used to increase the heat dissipating effect.

FIG. 3 shows that a fan 4 is installed above the two small heat dissipating elements 2. The fan forms cool air to flow downwards so that air can flow through the fin set 11 and fin sets 21 of the large heat dissipating element 1 and the small heat dissipating elements 2 and then are vented out from two sides of the large heat dissipating element 1 so as to have a preferred heat dissipating effect.

The present invention is thus described; it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heat dissipating module comprising:

a large heat dissipating element having a base and a first fin set on an upper side of the base; a lateral side of the base having a plurality of holes;

a plurality of small heat dissipating elements; each small heat dissipating element having a base and a second fin set; the small heat dissipating elements being placed upon an upper side of the first fin set; a lateral side of each small heat dissipating element having a hole; and a plurality of heat conducting elements which are embedded into the holes of the small heat dissipating elements and the large heat dissipating element.

2. The heat dissipating module of claim 1, wherein a fan is placed upon the second fin sets of the small heat dissipating elements.

* * * * *